US008921790B2

(12) United States Patent
Chalk et al.

(10) Patent No.: US 8,921,790 B2
(45) Date of Patent: Dec. 30, 2014

(54) IR DETECTOR SYSTEM AND METHOD

(75) Inventors: Chris Chalk, Basildon (GB); Peter Thorne, Basildon (GB)

(73) Assignee: Selex ES Ltd., Essex (GB)

( * ) Notice: Subject to any disclaimer, the term of this patent is extended or adjusted under 35 U.S.C. 154(b) by 0 days.

(21) Appl. No.: 13/255,044

(22) PCT Filed: Mar. 5, 2010

(86) PCT No.: PCT/EP2010/052837
§ 371 (c)(1),
(2), (4) Date: Sep. 6, 2011

(87) PCT Pub. No.: WO2010/100260
PCT Pub. Date: Sep. 10, 2010

(65) Prior Publication Data
US 2011/0315879 A1    Dec. 29, 2011

(30) Foreign Application Priority Data
Mar. 6, 2009    (GB) .................................. 0903864.7

(51) Int. Cl.
*G01J 5/00*    (2006.01)
*H03M 1/46*    (2006.01)
*H03M 1/12*    (2006.01)
*H03M 1/68*    (2006.01)
*H03M 1/80*    (2006.01)

(52) U.S. Cl.
CPC .............. *H03M 1/468* (2013.01); *H03M 1/123* (2013.01); *H03M 1/68* (2013.01); *H03M 1/804* (2013.01)
USPC .................................................... 250/338.1

(58) Field of Classification Search
USPC .................................................... 250/338.1
See application file for complete search history.

(56) References Cited

U.S. PATENT DOCUMENTS

| 4,799,106 | A |   | 1/1989  | Moore et al. |         |
|-----------|---|---|---------|--------------|---------|
| 5,570,091 | A | * | 10/1996 | Noro et al.  | 341/161 |
| 5,880,691 | A | * | 3/1999  | Fossum et al.| 341/162 |

(Continued)

FOREIGN PATENT DOCUMENTS

EP    0213867    3/1987

OTHER PUBLICATIONS

International Search Report (PCT/ISA/210) for PCT/EP2010/052837 dated Aug. 4, 2010.

(Continued)

*Primary Examiner* — David Porta
*Assistant Examiner* — Edwin Gunberg
(74) *Attorney, Agent, or Firm* — Buchanan Ingersoll & Rooney PC

(57) ABSTRACT

An Infra Red detector system and method are disclosed for a SAR ADC capable of operation at low power and for use on a Focal Plane Array FPA) detector. High power consumption makes known converter approaches unattractive for use on Focal Plane Array (FPA) detectors that are to be cooled to cryogenic temperatures. Many such ADCs are used on a FPA detector (e.g., up to one ADC per column of the imaging array) to digitize image data for the whole array at standard frame rates. Increased power makes cooling difficult to achieve or unattractive at system level. An exemplary system as disclosed can use an adaptive approach to set the comparator gain and settling time depending on the dynamics of the input signal, thereby achieving specified performance while reducing overall power.

14 Claims, 4 Drawing Sheets

(56) References Cited

U.S. PATENT DOCUMENTS

| | | | |
|---|---|---|---|
| 6,028,309 A * | 2/2000 | Parrish et al. | 250/332 |
| 6,778,123 B1 | 8/2004 | Bock et al. | |
| 2006/0022864 A1* | 2/2006 | Lee | 341/169 |

OTHER PUBLICATIONS

Written Opinion (PCT/ISA/237) for PCT/EP2010/052837 dated Aug. 4, 2010.

United Kingdom Search Report for GB 0903864.7 dated Jun. 10, 2009.

H. Guo et al., "A Low-Power 16-bit 500 kS/s ADC", Microelectronics and Electron Devices, Apr. 15, 2005, pp. 84-87.

K. Tan et al., "Error Correction Techniques for High-Performance Differential A/D Converters", IEEE Journal of Solid-State Circuits, Dec. 1, 1990, pp. 1318-1327, vol. 25, No. 6.

\* cited by examiner

IR DETECTOR SYSTEM AND METHOD

The invention relates to an Infra Red (IR) detector system and method. More specifically, but not exclusively, it relates to an IR detector system and method comprising a low power comparator optimised for use in Successive Approximation Register (SAR) Analogue to Digital convertors (ADCs).

Conventional approaches to achieve high performance Successive Approximation Register (SAR) Charge Share Analogue to Digital Converters (ADC) require high gain comparators to achieve settling performance and high resolution which consume high power. High power consumption makes such converter approaches unattractive for use on Focal Plane Array (FPA) detectors that have to be cooled to cryogenic temperatures. Many such ADCs are used on a FPA detector (i.e. up to one ADC per column of the imaging array) to digitise image data for the whole array at standard frame rates. Increased power makes cooling difficult to achieve or unattractive at system level.

The present invention aims to overcome these shortcomings and produce a SAR ADC capable of operation at low power such that it may be suitable for use on Focal Plane Array (FPA) detectors.

Accordingly, there is provided an IR detector system comprising at least one comparator and a Focal Plane Array (FPA) detector in which the at least one comparator is optimised for use in Successive Approximation Register (SAR) Analogue to Digital Convertors (ADC), the gain of said comparator being adaptable to reduce overall power consumption of the system such that the SAR ADC may be used on the FPA detector.

The invention will now be described with reference to the accompanying diagrammatic drawings in which.

Figure 1:
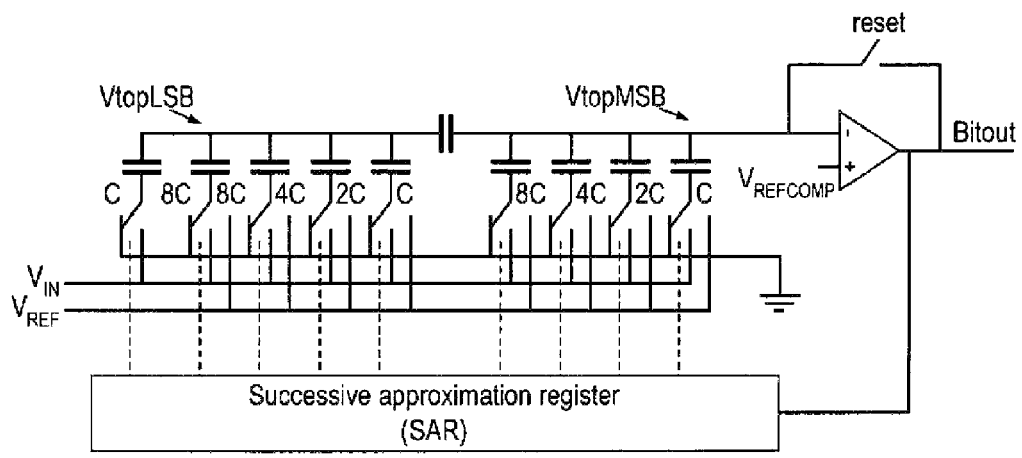
FIG. 1 is a schematic diagram of SAR ADC architecture comprising capacitor array, successive approximation register and high gain comparator

A typical SAR ADC consists of a Digital to Analogue Converter (DAC), comparator, and a digital successive approximation register and is shown in FIG. 1.

As the circuit is clocked, capacitors are switched in sequence from the largest to the smallest and the comparator compares the bit weighted signal scaled voltage with a reference voltage. Capacitors are selected or deselected by the SAR logic depending on the comparator output resulting in a digital representation of the input analogue signal. As the comparator input voltage approaches a reference voltage level, higher comparator gain is required to resolve a comparator output signal resulting in higher comparator power to achieve the circuit function. Operation at higher speeds becomes limiting as the effects of signal settling time impact comparator and therefore ADC performance. Additional time is required to achieve signal settling. The ability of the comparator to respond can be characterised by threshold limits applied around the nominal crossover point and are typically ±10 mV. Increasing the gain reduces the threshold limits.

Observation of the DAC output during a typical SAR conversion using a 2V DAC reference shows that for about half the time the DAC output operates outside of the nominal ±10 mV threshold limits. It follows that the gain of the comparator during these times does not need to be as high.

Figure 2:
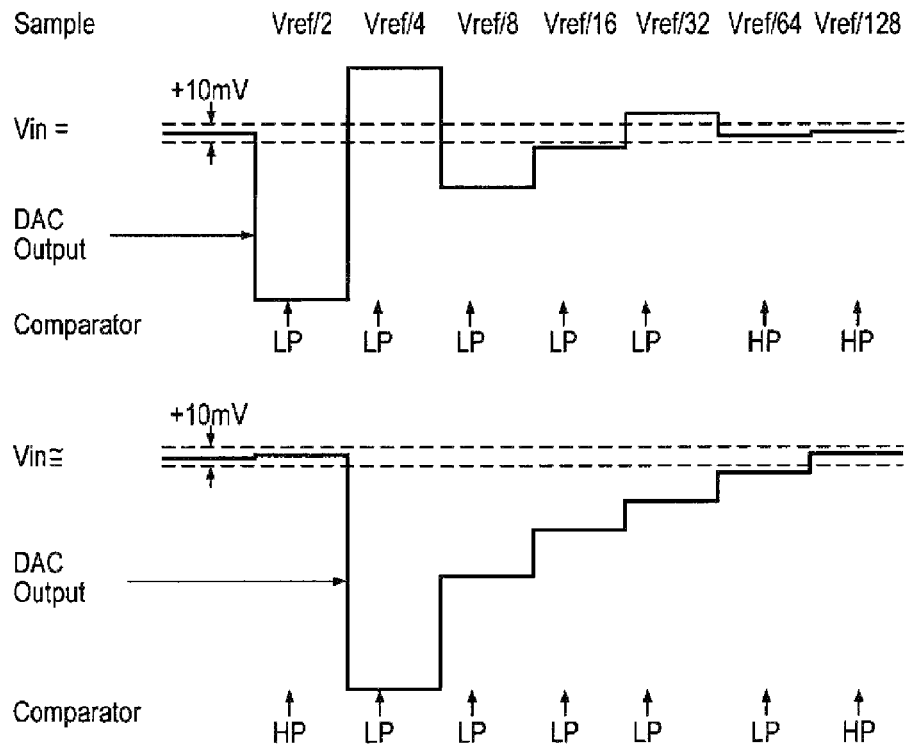
FIG. 2 is a schematic diagram of a DAC and comparator output operation with two example input signal levels.

However, two conversion waveforms are shown in FIG. 2 in which Vin=0.2V and Vin~Vref/2 from which it can be seen that it is not known what comparator gain will be required a priori during the early part of the conversion process. The comparator operates with low power (LP) as low gain is required for part of the conversion. It should also be noted that as the DAC voltage converges towards the input voltage, there is a point after which high comparator gain is required to resolve the remainder of the signal. The threshold is detected and the comparator operates with high power (HP) as high gain is required.

It can be seen that to achieve performance higher power is required to achieve low thresholds and to achieve settling. However, high gain and accurate settling is only required for a proportion of the total conversion period giving an opportunity to save overall power.

Figure 3:
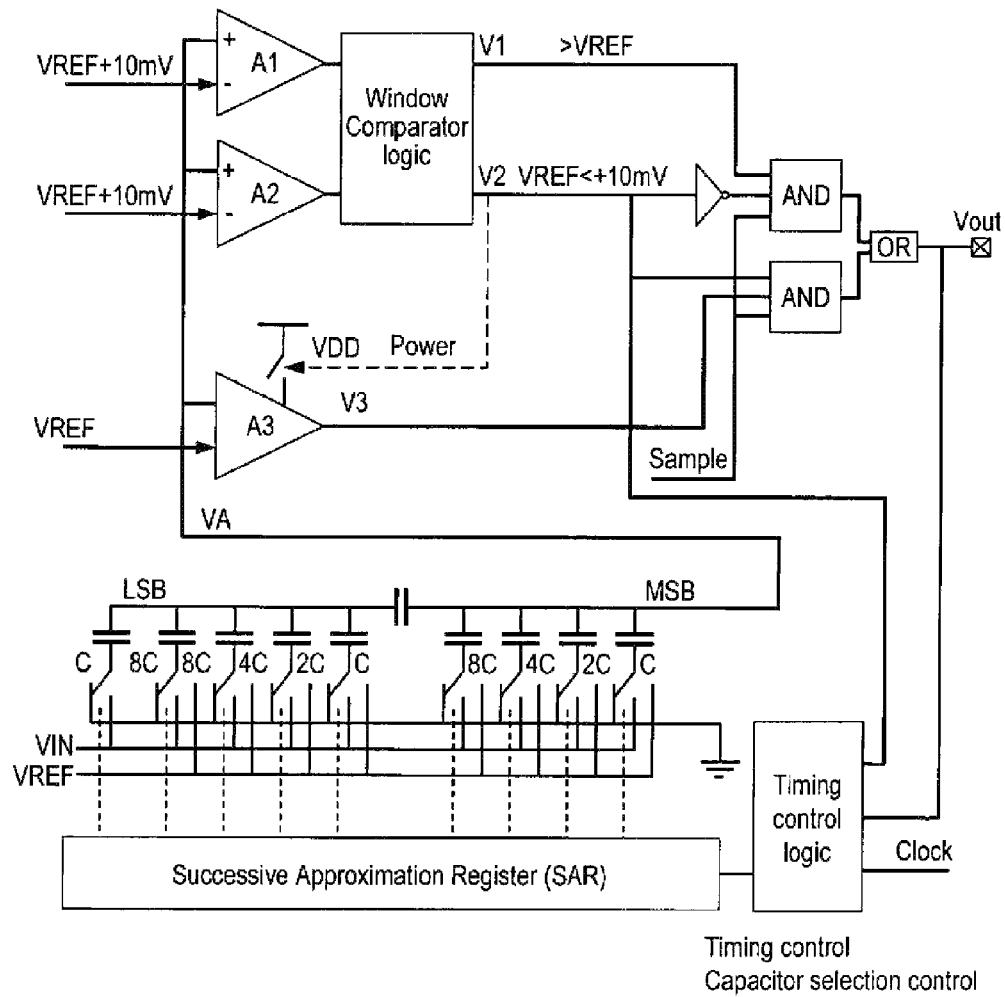
FIG. 3 is a schematic diagram of a revised SAR ADC architecture using low and high gain comparators and control logic to adjust comparator and timing to signal dynamics in accordance with one form of the invention.

One form of the invention as shown in FIG. 3 uses an adaptive approach to set the comparator gain and settling time depending on the dynamics of the input signal, achieving performance whilst reducing overall power.

A two stage comparison approach is used. In the first quarter of the bit comparison period a fast low power window comparator (A1, A2) compares the DAC output to a narrow voltage range which in this case set to +/−10 mV about the reference voltage 'VREF'. The window comparator logic generates an output logic signal 'V1' if the DAC output is outside this range. The high gain comparator uses ½ of the bit conversion period to allow sufficient time for settling. For this case, the window comparator output V1 is used as the final comparator output signal, 'Vout', when the control input signal 'Sample' is asserted. If the DAC output is within the narrow window range then a high gain comparator (A3) is powered on and is used as the final comparator output signal 'Vout', when 'Sample' is asserted. The timing control logic senses the comparator outputs 'V2' and 'V3' and with the 'Clock' signal is used control the capacitor and comparator settling. This architecture and circuit realisation ensures the high gain comparator is only switched in when needed to resolve high resolution DAC signals that are smaller than the threshold voltage thereby saving power.

The window comparator voltage range is set to be just greater than the expected window comparator threshold. However in the case of implementing an ADC per column for a focal plane array readout IC application, each ADC instance will have its own threshold characteristic due to the affects of matching and non uniformity at device level. The apparent requirement to then set each ADC comparator voltage individually is overcome within the architecture of the adaptive circuit by using a common window comparator voltage for all ADC instances and setting it to encompass the range of the ADC thresholds. Each ADC instance operates independently, switching in the high power comparator only when required. Where there is poorer matching, the spread in threshold voltage will be higher. The window comparator voltage range will need to be set commensurately higher and the high gain comparator will be switched in earlier resulting in a power increase. A power saving is still achieved as the high gain comparator is not operating all the time.

Figure 4A:
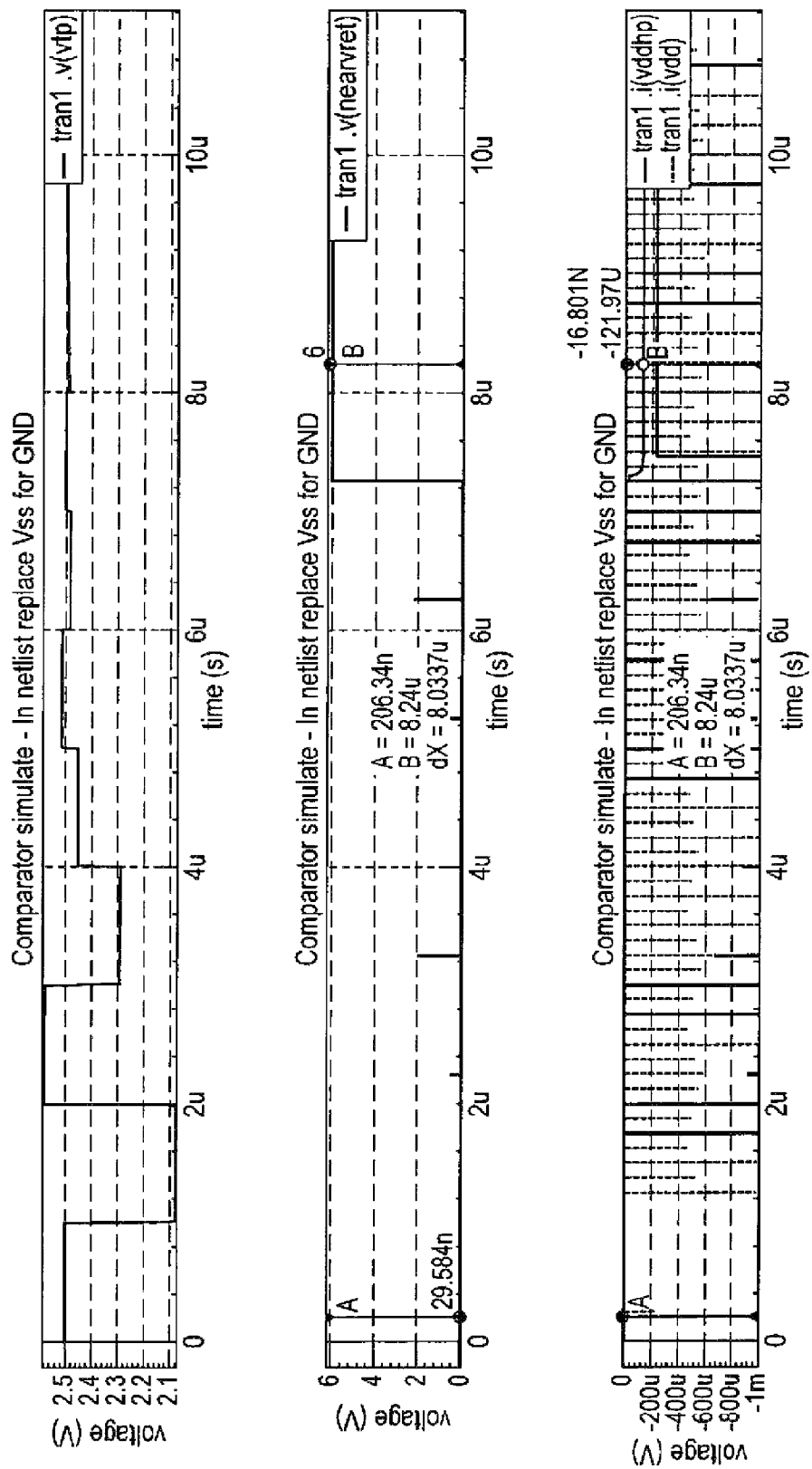
FIG. 4 is a schematic diagram showing a number of example design timing waveforms.
Figure 4B:
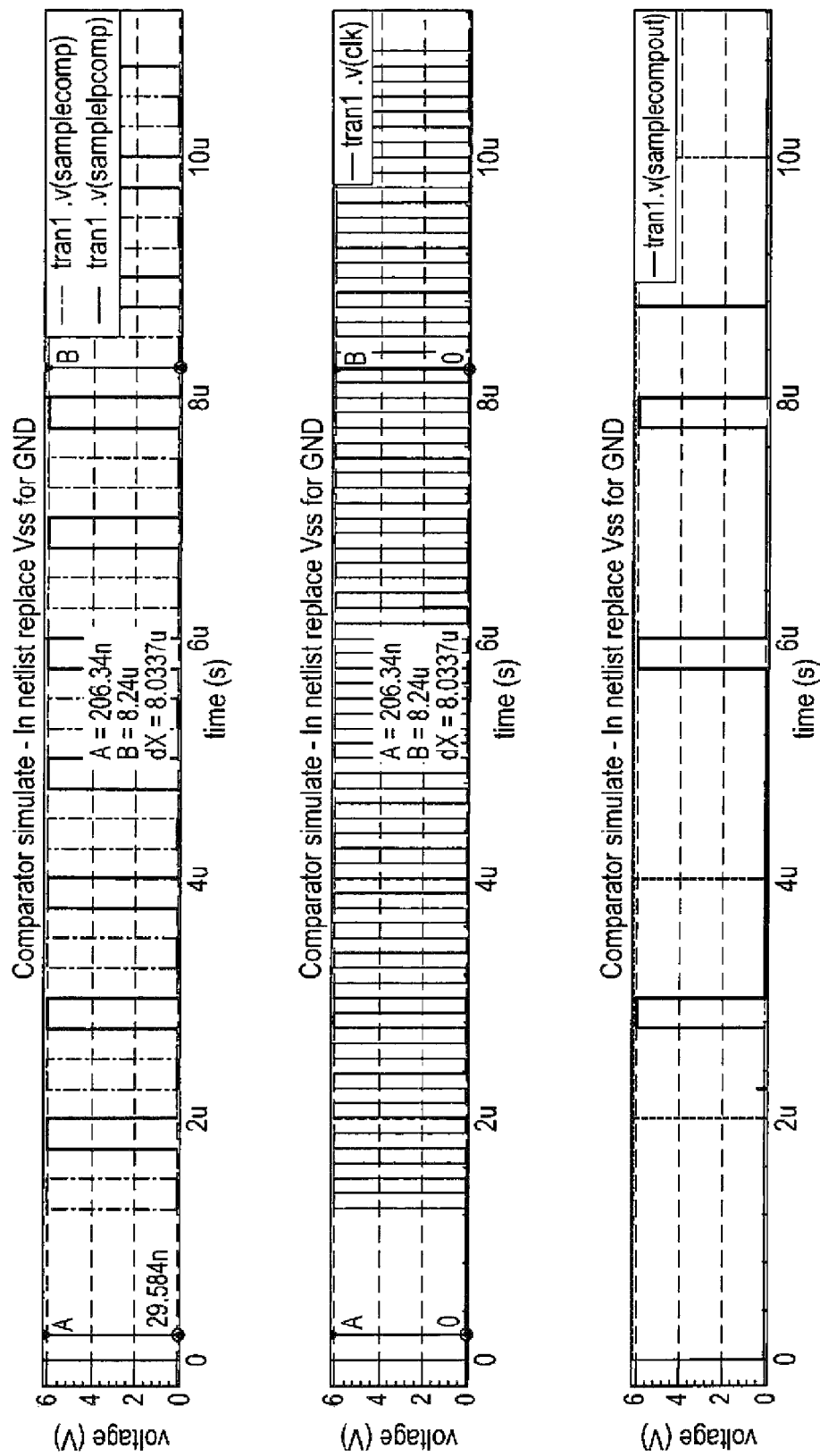

This novel approach has been demonstrated in a specific embodiment that is described below in an example design. The scheme implements a variable gain comparator and timing and has been simulated. (See FIG. 4) The first trace is the DAC output and after 7 uS the second trace shows that the window comparator has detected that the voltage range is within ±10 mV of the 2.5V voltage reference. The high gain comparator turns on as can be seen in Trace 3 with the current increasing to 120 uA. The fourth trace shows the sampling of the low power comparators that occurs within the first quarter of the DAC sample period and the sampling of the high power comparator that occurs after ¾ of the DAC sampling period. The fifth trace is the x4 clock and the sixth trace shows the combined comparator output.

Assuming a 2.5V signal input range and threshold in the range of +/−5 to 10 mV, the high gain comparator will only be operating between 7 and 9 bits of the 14 bit conversion period thereby reducing the average power consumption by a factor of 40% to 50%.

It will be appreciated that power consumption may be reduced by different factors and that the example circuit design given above is only one form of circuit that is anticipated. Circuits having other parameters such as different input signal ranges and thresholds may be used.

The invention claimed is:

1. An Infra Red (IR) detector system comprising:
   at least one first comparator;
   a second comparator; and
   a Focal Plane Array (FPA) detector in which the at least one first comparator is configured for use in Successive Approximation Register (SAR) Analogue to Digital Convertors (ADC),
   wherein the at least one first comparator is a window comparator that compares an output of a respective SARADC to a range of voltages, and the second comparator is connected to be controlled via a signal received from the at least one first comparator to use less than a full bit conversion period to compare an output of the SARADC to a second voltage such that a gain produced by the comparators reduces overall power consumption of the system.

2. The IR detector system according to claim 1,
   wherein the at least one first comparator is configured in accordance with a timing of a system clock to respond to dynamic characteristics of an input signal.

3. The IR detector system according to claim 1,
   wherein the first and second comparators are configured to adjust system power and performance characteristics based on at least the range of voltages.

4. The IR detector system according to claim 3, in which the range of voltages of the at least one first comparator encompasses a spread of threshold voltages to be compared to the output of the respective SARADC.

5. The IR detector system according to claim 1, wherein the gain of the comparators is optimized for the SAR ADC of a specified FPA detector.

6. The IR detector system according to claim 2, comprising:
   wherein the first and second comparators are configured to adjust system power and performance characteristics based on at least the range of voltages.

7. The IR detector system according to claim 5, in which the range of voltages of the at least one first comparator encompasses a spread of threshold voltages to be compared to the output of the respective SARADC.

8. A method of IR detection in a Successive Approximation Register Analogue to Digital Convertor (SARADC) of a Focal Plane Array detector having at least one first comparator and a second comparator, wherein the at least one first comparator is a window comparator configured to compare an output of the SARADC to a range of voltages, and the second comparator is connected to be controlled via a signal received from the at least one first comparator to compare an output of the SARADC to a second voltage, the method comprising:
   optimizing a gain of the comparators for adjusting an output of the SARADC of a Focal Plane Array detector; and
   reducing overall power consumption of IR detection in the SARADC based on the control of the second comparator by the at least one first comparator when the output of the SARADC is within the voltage range, by using less than a full bit conversion period to compare the output of the SARADC to the second voltage.

9. The method of IR detection according to claim 8, comprising:
   adapting the at least one first comparator and a timing of IR detection to respond to dynamic characteristics of an input signal.

10. The method of IR detection according to claim 8, comprising:
    configuring the first and second comparators to adjust power and performance characteristics of the system based on at least the range of voltages.

11. The method of IR detection according to claim 8, comprising:
    setting the threshold voltage of the at least one comparator to encompass a spread of threshold voltages to be compared to the output of the respective SARADC.

12. The IR detection system according to claim 1, wherein the second comparator is switched on by an output of the at least one first comparator.

13. The IR detection system according to claim 12, wherein the first and second comparators are connected such that the second comparator is functional for half a bit conversion period of the SARADC.

14. The IR detector system according to claim 1, wherein the second comparator is functional for half a bit conversion period of the SARADC.

* * * * *